United States Patent [19]

Bader

[11] Patent Number: 4,918,738

[45] Date of Patent: Apr. 17, 1990

[54] STRUCTURAL ASSEMBLY FOR HOUSING AN ACOUSTICAL SYSTEM

[75] Inventor: Joseph F. Bader, Crete, Ill.

[73] Assignee: Federal Signal Corporation, Oak Brook, Ill.

[21] Appl. No.: 279,498

[22] Filed: Dec. 5, 1988

[51] Int. Cl.[4] .............................................. H01L 41/08

[52] U.S. Cl. .................................... 381/190; 381/153; 381/173; 381/205; 181/155; 181/160; 310/324; 310/327

[58] Field of Search ............... 381/190, 153, 159, 161, 381/158, 188, 205, 173; 181/160, 158, 155; 310/322, 326, 324, 327, 348

[56] References Cited

U.S. PATENT DOCUMENTS

| | | | |
|---|---|---|---|
| 3,909,530 | 9/1975 | Gosswiller | 381/158 |
| 3,921,016 | 11/1975 | Livermore et al. | 381/173 |
| 4,292,561 | 9/1981 | Martin | 381/153 |
| 4,368,400 | 1/1983 | Taniguchi et al. | 310/326 |
| 4,413,198 | 11/1983 | Bost | 381/159 |
| 4,602,245 | 7/1986 | Yang et al. | 310/322 |
| 4,604,606 | 8/1986 | Sweany | 310/324 |
| 4,811,816 | 3/1989 | Lin | 381/159 |

FOREIGN PATENT DOCUMENTS

| | | | |
|---|---|---|---|
| 3135096 | 9/1982 | Fed. Rep. of Germany | 310/324 |

*Primary Examiner*—Jin F. Ng
*Assistant Examiner*—Wing F. Chan
*Attorney, Agent, or Firm*—Davis Chin

[57] ABSTRACT

An acoustical system for generating loud sound levels over a wider bandwidth includes a generally cylindrically-shaped cavity formed of a wall member and having front and back ends. A baffle member is disposed to close the front end of the cavity, and a rear wall panel is disposed to close the back end of the cavity. A crystal/diaphragm driver assembly is formed of a bimorph piezoelectric crystal of a generally circular configuration and a generally conical-shaped diaphragm whose apex is fixedly attached to the center of the crystal. The driver assembly serves to convert electrical signals applied thereto into acoustical signals. The crystal is freely suspended at a first predetermined distance from the rear wall panel to form a rear Helmholtz loading chamber therebetween. The baffle member is spaced at a second predetermined distance from the crystal so as to form a front, outer enclosing chamber therebetween.

14 Claims, 3 Drawing Sheets

STRUCTURAL ASSEMBLY FOR HOUSING AN ACOUSTICAL SYSTEM

BACKGROUND OF THE INVENTION

This invention relates generally to acoustic transducers having a piezoelectric bimorph structure and more particularly, it relates to an improved Helmholtz acoustical system which includes a tunable rear Helmholtz chamber and a tunable, front outer enclosing chamber both disposed within a single cavity so as to provide loud sound levels over a wider audio frequency range.

As is generally known, there exists in the prior art acoustic transducers which utilize piezoelectric elements suitably bonded to a support structure mounted in a singular specially-tuned cavity, as is shown in FIG. 1*a*. This is typically referred to as a single Helmholtz design wherein a piezoelectric crystal 2 mounted on a brass plate 4 is used to form the rear wall of a chamber 6. There is also known in the prior art acoustic transducers which have piezoelectric elements suitably bonded to a support structure mounted in dual specially-tuned cavities, as is shown in FIG. 1*b*. This is generally referred to as a dual Helmholtz design wherein a piezoelectric crystal B mounted on a brass plate 10 is used to separate first and second chambers 12, 14. While the single Helmholtz designs do offer relatively high sound levels, they suffer from the disadvantage of having a narrow bandwidth. The existing dual Helmholtz systems do offer a wider bandwidth, but this is achieved only at the expense of difficult assembly and through bulky designs for coupling the first and second chambers to a front radiating area.

It would therefore be desirable to provide an improved acoustical system for generating loud sound levels having a wider bandwidth. The acoustical system of the present invention represents an improvement over the existing singular and dual Helmholtz designs. The present acoustical system includes a tunable rear Helmholtz chamber coupled to a tunable front, outer enclosing chamber both disposed within a single cavity.

SUMMARY OF THE INVENTION

Accordingly, it is a general object of the present invention to provide an improved acoustical system which is relatively simple and economical to manufacture, assemble and tune, but yet overcomes the disadvantages of the prior art acoustic transducers.

It is an object of the present invention to provide an improved acoustical system for generating loud sound levels with a wider bandwidth than those traditionally available in the prior art.

It is another object of the present invention to provide an improved acoustical system for generating loud sound levels which has increased efficiency and thus reduces the amount of power consumption delivered from the electrical signaling source.

It is still another object of the present invention to provide an improved acoustical system for generating loud sound levels at increased efficiency which therefore better utilize a conventional battery power supply and thus reducing manufacturing costs.

It is yet still another object of the present invention to provide an improved acoustical system which includes a tunable rear Helmholtz chamber coupled to a tunable front, outer enclosing chamber both disposed within a single cavity.

In accordance with these aims and objectives, the present invention is concerned with the provision of an acoustical system for generating loud sound levels over a substantially wider audio frequency range which includes a generally cylindrically-shaped cavity formed of a wall member and having front and back ends. A baffle member is disposed to close the front end of the cavity, and a rear wall panel is disposed to close the back end of the cavity. A crystal/diaphragm driver assembly is formed of a bimorph piezoelectric crystal of a typically circular configuration and a generally conically-shaped diaphragm whose apex is fixedly attached to the center of the crystal. The driver assembly serves to convert electrical signals applied thereto into acoustical signals. The crystal is suitably mounted at a first predetermined desired distance from the rear wall panel so as to form a rear Helmholtz loading chamber therebetween. The baffle member is spaced at a second predetermined desired distance from the piezoelectric crystal so as to form a front, outer enclosing chamber therebetween.

BRIEF DESCRIPTION OF THE DRAWINGS

These and other objects and advantages of the present invention will become more fully apparent from the following detailed description when read in conjunction with the accompanying drawings with like reference numerals indicating corresponding parts throughout, wherein.

DESCRIPTION OF THE PREFERRED EMBODIMENT

Figure 2:
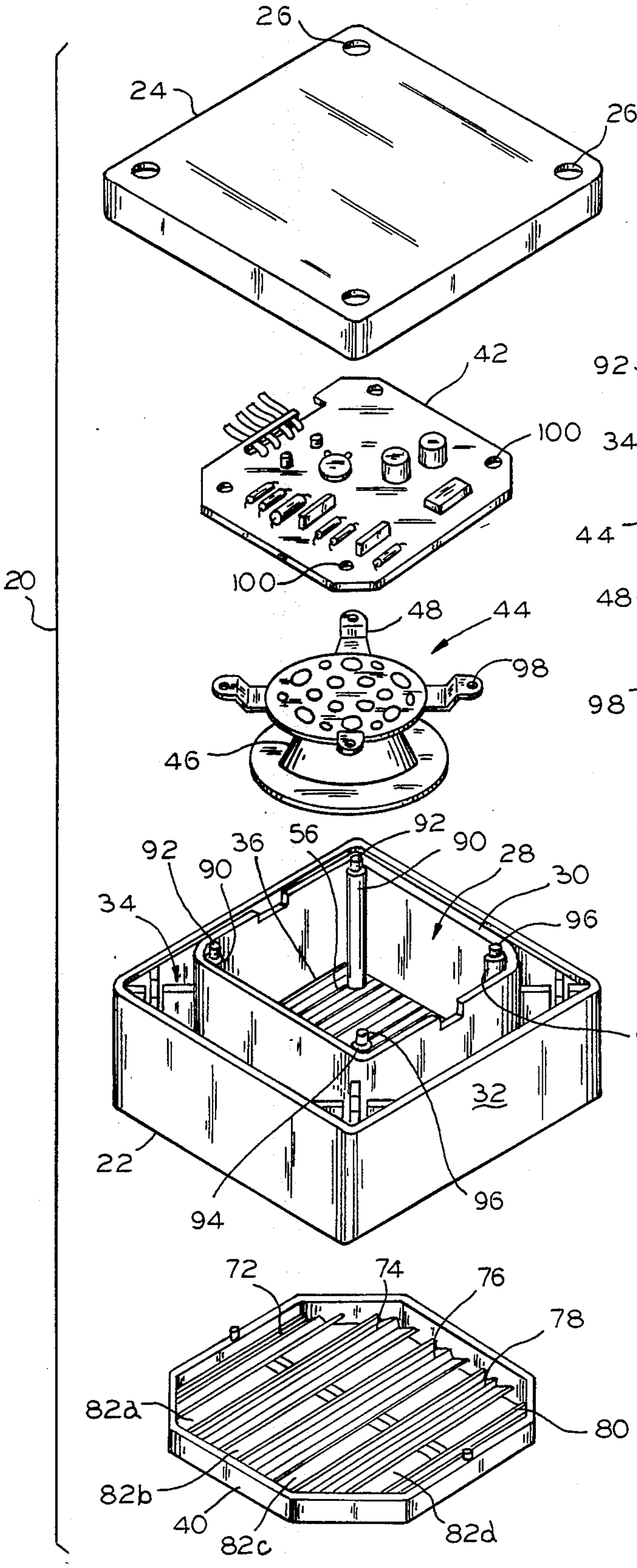
FIG. 2 is an exploded, perspective view of an acoustical system constructed in accordance with the principles of the present invention.

Referring now in detail to the various views of the drawings and particularly to FIGS. 2–5, there is shown an improved acoustical system 20 of the present invention which includes a generally rectangularly-shaped housing 22 and a co-mating rear cover plate 24 secured to the back of the housing 22 by four screws 26 extending therethrough. A substantially tubularly-shaped or cylindrically-shaped cavity 28 is formed within the housing 22 by an elongated wall member 30. The housing 22 includes a side wall 32 which is disposed coaxially with the wall member 30 at a spaced apart distance forming a gap 34 therebetween. While the cross-sectional area of the cavity 28 is preferably circular in shape, it should be understood that the shape could also be made to be rectangular, square, oval and the like.

One end of the cavity adjacent the front end of the housing is closed by a baffle member 36 which is formed integrally with the housing 22. The housing includes an octagon-shaped recess 38 disposed in front of the baffle member 36. A removable protective grille 40 is arranged to fit within the recess 38 so as to prevent damage to a driver assembly caused by entry of foreign materials and the like into the cavity 28 from the outside environment. Further, the other end of the cavity adjacent the rear cover plate 24 is closed by a rear wall panel 42.

Within the single cavity 28, there is disposed a bimorph piezoelectric crystal 44 and a generally conically-shaped diaphragm 46 mounted integrally therewith to form a crystal/diaphragm driver assembly. The driver assembly is utilized for providing conversions between electrical and mechanical stimuli. The apex of the conically-shaped diaphragm is fixedly attached to the center of the piezoelectric crystal. Further, the central or horizontal axis of the conically-shaped diaphragm extends in a direction which is perpendicular to the plane of the crystal.

The crystal 44 has a generally circular configuration and is provided with four equally-spaced and flexible mounting tabs 48 for freely suspending the driver assembly within the cavity 28 so that the crystal 44 is positioned at a first predetermined desired distance from the rear wall panel 42, as will be more fully explained hereinafter. This rear wall panel 42 is actually a printed circuit board which has mounted on its back side electronic circuitry for applying electrical signals to the piezoelectric crystal 44 so as to convert the electrical signals applied thereto into acoustical signals. The electronic circuitry is suitably powered by a conventional battery and/or power supply.

Since the crystal 44 is not used as the rear wall as in the prior art Helmholtz structures, a tunable rear Helmholtz loading chamber 50 has been created by a compliance (trapped air) between the rear wall panel 42 and the piezoelectric crystal 44. The accompanying mass (movable air) for the loading chamber 50 is located between the edge 45 of the crystal and the inner surface of the wall member 30. A major advantage has now been achieved due to the fact that the rear wall panel 42 functions not only as an acoustic loading plate but also serves as a rear seal of the chamber 50. The distance between the crystal and the real wall 42 must be adjusted or tuned in use for a first specific desired frequency. Typically, the loading chamber 50 is tuned to a fundamental resonant frequency of the mechanical crystal/diaphragm driver assembly. i.e.. such as 2900 Hz.

By freely suspending the crystal 44 away from the rear wall panel 42, there has been simultaneously created a tunable front, outer enclosing chamber 52 which is disposed within the single cavity 28 as well. This enclosing chamber 52 has been created by a compliance (trapped air) between the piezoelectric crystal 44 and the baffle member 36. The distance between the crystal 44 and the baffle member 36 must be adjusted or tuned in use for a second specific desired frequency.

Typically, the front, outer enclosing chamber 52 is tuned slightly above the fundamental resonant frequency of the loading chamber 50. As a result, the rear chamber 50 produces a better acoustic load (lower acoustic impedance) to the mechanical crystal/diaphragm assembly and thus permits acoustical energy to be transferred to its surrounding air. Therefore, acoustical energy is transferred to the front chamber 52 with greater efficiency. Further, the accompanying mass (movable air) for the front chamber 52 is located between the baffle member 36 and the front protective grille 40 and thus provides an acoustic mass which also facilitates coupling of the front chamber 52 to the air 54 in the outside environment.

The baffle member 36 is typically formed of four horizontally-extending deflection bar sections 56, 58, 60 and 62 disposed between a plurality of openings **64*a*, 64*b*, 64*c*, 64*d* and 64*e*. Each of the bar sections 56–62 is formed by a pair of outwardly-directed V-shaped grooves 66. Each of the grooves 66 is constructed by surfaces 68 and 70 which are disposed at a 45 degree angle to a horizontal plane that is parallel to the horizontal axis of the diaphragm 46**.

As was previously described, the front protective grille 40 is located within the recess 38 at the front end of the housing 22 and is retained therein by conventional means. The grille 40 is disposed at a predetermined distance in front of the baffle member 36 and is typically formed of five horizontally-extending deflection bar sections 72, 74, 76, 78 and 80. The bar sections 74, 76 and 78 are disposed between a plurality of openings **82*a*, 82*b*, 82*c* and 82*d*. Each of the bar sections 72–80 is formed by a pair of inwardly-directed V-shaped grooves 84. Each of the grooves 84 is constructed by surfaces 86 and 88** which are disposed at a 45 degree angle to the horizontal plane.

Figure 5:
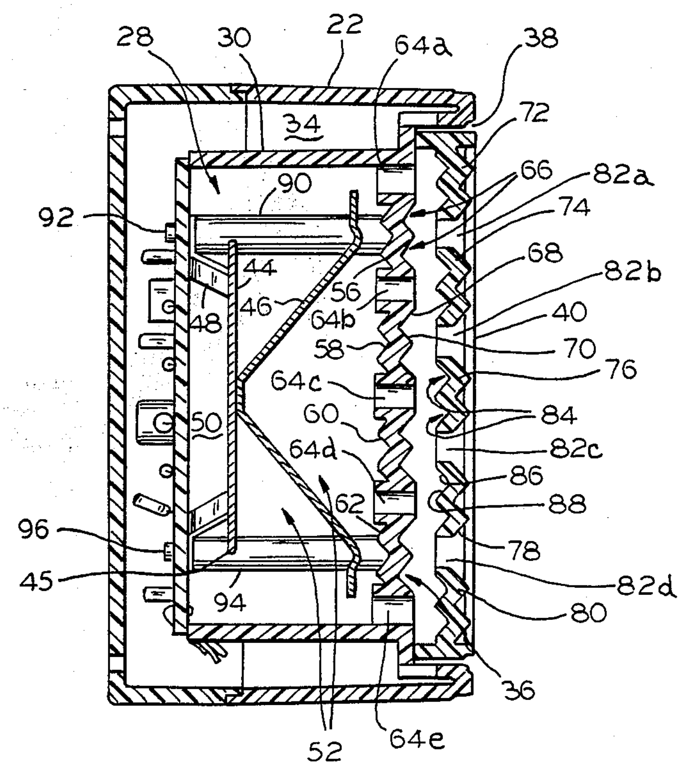
FIG. 5 is a cross-sectional view of the fully assembled acoustical system, taken along the lines 5—5 of FIG. 4.

It should be noted that the grille 40 and the baffle member 36 are complementary to one another so that when they are assembled as shown in FIG. 5 a very short or shallow re-entrant horn is provided. The grille 40 is designed so that the junctures between the grooves 84 of the bar sections 74–78 are aligned with the respective openings **64*a*–64*e* of the baffle member 36. Further, the junctures between the grooves 66 of the bar sections 56–62 of the baffle member 36 are aligned with the respective openings 82*a*–82*d* of the grille 40**.

It should be apparent to those skilled in the art that the sound waves created and propelled forwardly through the front chamber 52 will be passed initially through the openings **64*a*–64*e* in the baffle member 36. Then, the sound waves will be deflected rearwardly by typical surfaces 86 and 88 of each of the deflection bar sections 72–80 of the grille 40. The rearwardly deflected sound waves will strike typical surfaces 68 and 70 of each of the deflection bar sections 56–62 of the baffle member 36 and will be finally sent forward through the openings 82*a*–82*e* of the grille 40 to the outside air 54**.

As can best be seen from FIG. 2, a pair of support posts 90 are fixedly secured to the distal ends of the bar section 56 of the baffle member 36. The support posts 90 extend from the back side of the bar section 56 in a parallel relationship to the horizontal axis of the diaphragm 46. Each of the support posts 90 is terminated at its free end by a mounting pin 92. Similarly, a pair of support posts 94 are fixedly secured to the distal ends of the bar section 62 of the baffle member 36. The support posts 94 extend from the back side of the bar section 62 in a parallel relationship to the horizontal axis of the diaphragm. Each of the support posts 94 is terminated at its free end by a mounting pin 96.

Figure 3:
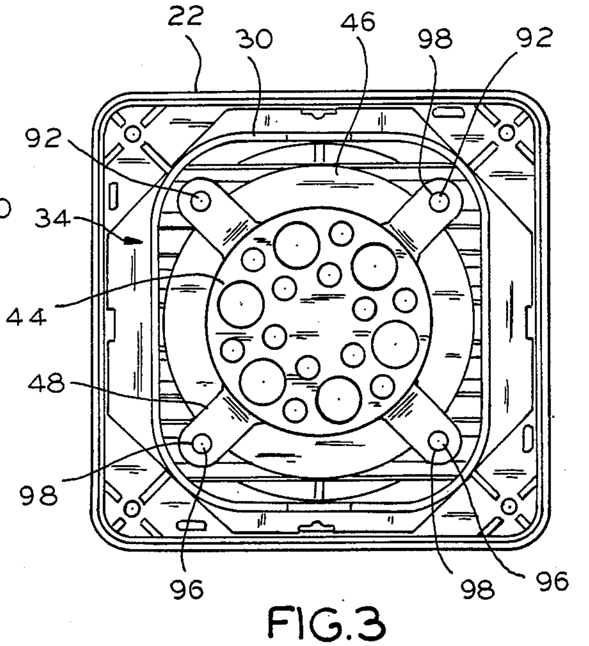
FIG. 3 is a partially assembled perspective view of FIG. 2.

As seen from FIG. 3, the mounting tabs 48 of the crystal 44 are each provided at their ends with opening 98 which are received by the corresponding mounting pins 92 and 96 so as to suspend freely the crystal 44 within the cavity 28. The rear wall panel 42 is also provided with aligned openings 100 which are also received by the corresponding mounting pins 92 and 96 so as to close the back end of the cavity 28. In this fashion, the crystal 44 is positioned so as to be at the first predetermined distance from the rear wall panel 42 in order to form the rear Helmholtz chamber 50 therebetween.

Figure 1A:
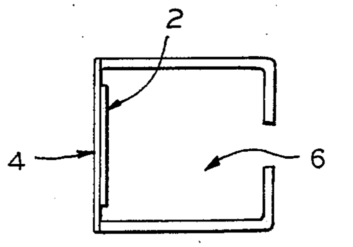
FIG. 1a (PRIOR ART)
FIG. 1*a* shows conventional Helmholtz design having a singular chamber.
Figure 6:
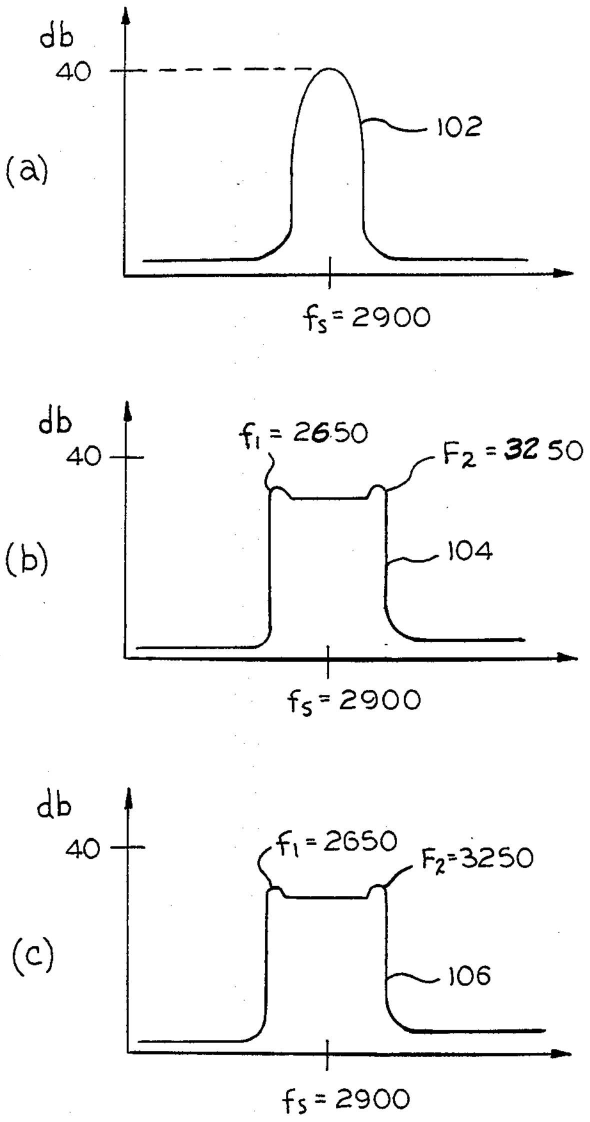
FIGS. 6*a*–6*c* are graphs illustrating generally the frequency responses of the designs similar to those depicted in respective FIGS. 1*a*, 1*b* and 5.

FIG. 6*a* illustrates the frequency response of the single Helmholtz design of FIG. 1*a*. The curve 102 depicts a single peak of a narrow bandwidth at the resonant frequency of approximately 2900 Hz. FIG. 6*b* illustrates the frequency response of the dual Helmholtz design of FIG. 1*b*. The curve 104 depicts two peaks of different resonant frequencies. By comparing the curves 102 and 104, it can be seen that the curve 104 has a lower value of Q but a wider bandwidth than the curve 102. FIG. 6*c* illustrates the response of the present invention depicted in the embodiment of FIG. 5. The curve 106 shows also two peaks at different resonant frequencies which are substantially identical to the frequencies of the curve 104. The curve 106 has substantially the same value of Q as the curve 104 as well as an approximately equal bandwidth, which is approximately 600 Hz.

The advantage of the present invention is that there is provided the capability of tuning separately the rear chamber 50 and the front chamber 52 similar to the existing dual Helmholtz designs but using only a single cavity. Further, the present invention provides loud sound levels over a wider range of audio frequencies (increased bandwidth) than the prior art single Helmholtz designs.

Figure 1B:
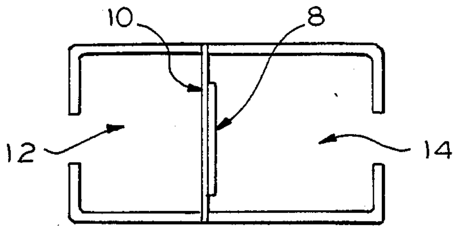
FIG. 1b (PRIOR ART)
FIG. 1*b* shows a conventional Helmholtz design having dual chambers.
Figure 4:
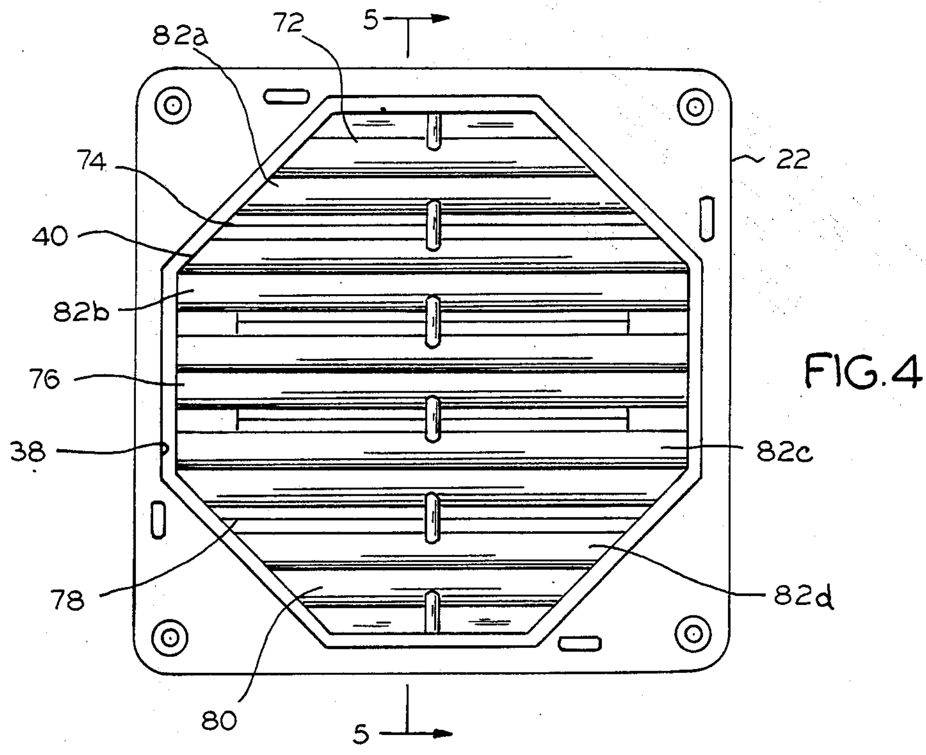
FIG. 4 is a front view of the acoustical system of the present invention.
Figure 7:
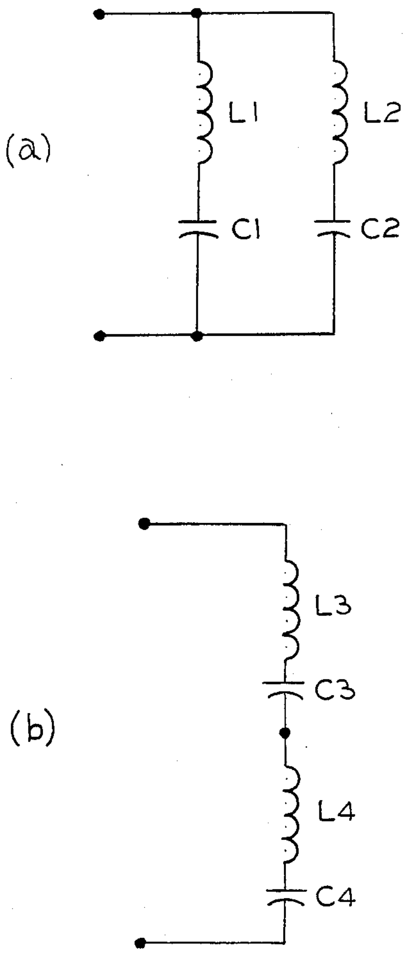
FIG. 7*a* is an equivalent electrical circuit for the conventional dual Helmholtz design of FIG. 1*b*.
FIG. 7*b* is an equivalent electrical circuit for the present acoustical system of FIG. 5.

In order to clearly show the distinctions between the prior art dual Helmholtz designs and the acoustical system of the present invention, equivalent electrical circuits for FIGS. 1*b* and 5 have been depicted in FIGS. 7*a* and 7*b*, respectively. FIG. 7*a* shows the equivalent electrical circuit for the dual Helmholtz design of FIG. 1*b*. The series inductance L1 and capacitance C1 correspond to the trapped air and movable air associated with the chamber 12. Similarly, the series inductance L2 and capacitance C2 correspond to the trapped air and movable air associated with the chamber 14. It should be noted that the two series LC circuits are connected in parallel.

In FIG. 7*b*, there is shown the equivalent electrical circuit for the acoustical system of the present invention in FIG. 5. The series inductance L3 and the capacitance C3 correspond to the trapped air and movable air associated with the rear Helmholtz chamber 50, and the series inductance L4 and capacitance C4 correspond to the trapped air and movable air associated with the front, outer enclosing chamber 52. It should be clearly noted that these latter two series LC circuits are connected in series rather than in parallel as in the former conventional dual Helmholtz designs.

From the foregoing detailed description, it can thus be seen that the present invention provides an improved acoustical system for generating loud sound levels over a substantially wider audio frequency range. The acoustical system of the present invention includes a tunable rear Helmholtz chamber coupled to a tunable front, outer enclosing chamber both disposed within a single cavity.

While there has been illustrated and described what is at present considered to be a preferred embodiment of the present invention, it will be understood by those skilled in the art that various changes and modifications may be made, and equivalents may be substituted for elements thereof without departing from the true scope of the invention. In addition, many modifications may be made to adapt a particular situation or material to the teachings of the invention without departing from the central scope thereof. Therefore, it is intended that this invention not be limited to the particular embodiment disclosed as the best mode contemplated for carrying out the invention, but that the invention will include all embodiments falling within the scope of the appended claims.

What is claimed is:

1. An acoustical system for generating loud sound levels over a wide audio frequency range comprising:

a generally cylindrically-shaped cavity formed of a wall member and having front and back ends;

a baffle member being disposed to close the front end of said cavity;

a rear wall panel being disposed to close the back end of said cavity;

a crystal/diaphragm driver assembly being formed of a piezoelectric crystal of a generally circular configuration and a generally conically-shaped diaphragm whose apex is fixedly attached to said crystal, said driver assembly converting electrical signals applied thereto into acoustical signals;

means for mounting said crystal at a first predetermined desired distance from said rear wall panel to form a rear Helmholtz leading chamber therebetween;

said means for mounting said crystal including a plurality of tabs formed on the edge of said crystal at equally spaced apart distances and a plurality of support posts extending from the back side of said baffle member and terminating in mounting pins, said tabs having openings at their free ends for receiving said mounting pins so as to locate said crystal at the first predetermined distance from said rear wall panel; and said baffle member being spaced at a second predetermined desired distance from said crystal so as to form a front, outer enclosing chamber.

2. An acoustical system as claimed in claim 1, further comprising a housing having a side wall which is disposed coaxially and surrounds said cavity at a spaced apart distance forming a gap therebetween.

3. An acoustical system as claimed in claim 2, wherein said housing has a recess formed in front of said baffle member, and wherein a protective grille is received within said recess to prevent damage to the crystal/diaphragm driver assembly due to entry of foreign materials and the like into the cavity.

4. An acoustical system as claimed in claim 1, wherein said rear Helmholtz loading chamber is tunable by adjusting the first distance between the crystal and the rear wall panel.

5. An acoustical system as claimed in claim 4, wherein said front, outer enclosing chamber is tunable by adjusting the second distance between the baffle member and the crystal.

6. An acoustical system as claimed in claim 5, wherein said rear chamber is tuned to the fundamental resonant frequency of the driver assembly and said front chamber is tuned to be slightly above the fundamental resonant frequency so as to produce a frequency response having a wider bandwidth.

7. An acoustical system as claimed in claim 1, wherein said rear panel wall comprises a printed circuit board for mounting of electronic circuitry.

8. An acoustical system as claimed in claim 3, further comprising a rear cover plate which is secured to the end of the housing opposite from said baffle member.

9. An acoustical system for generating loud sound levels over a wide audio frequency range comprising:

a generally cylindrically-shaped cavity formed of a wall member and having front and back ends;

a baffle member being disposed to close the front end of said cavity;

a housing including a side wall and being disposed coaxially and surrounds said cavity at a spaced apart distance forming a gap therebetween;

said housing having a recess formed in front of said baffle member;

a rear wall panel being disposed to close the back end of said cavity;

a crystal/diaphragm driver assembly being formed of a piezoelectric crystal of a generally circular configuration and a generally conically-shaped diaphragm whose apex is fixedly attached to said crystal, said driver assembly converting electrical signals applied thereto into acoustical signals;

a removable protective grille being disposed within the recess of said housing to prevent damage to the crystal/diaphragm driver assembly due to entry of foreign materials and the like into the cavity;

means for mounting said crystal at a first predetermined desired distance from said rear wall panel to form a rear Helmholtz loading chamber therebetween;

said means for mounting said crystal including a plurality of tabs formed on the edge of said crystal at equally spaced apart distances and a plurality of support posts extending from the back side of said baffle member and terminating in mounting pins, said tabs having openings at their free ends for receiving said mounting pins so as to locate said crystal at the first predetermined distance from said rear wall panel; and said baffle member being spaced at a second predetermined desired distance from said crystal so as to form a front, outer enclosing chamber.

10. An acoustical system as claimed in claim 9, wherein said rear Helmholtz loading chamber is tunable by adjusting the first distance between the crystal and the rear wall panel.

11. An acoustical system as claimed in claim 10, wherein said front, outer enclosing chamber is tunable by adjusting the second distance between the baffle member and the crystal.

12. An acoustical system as claimed in claim 11, wherein said rear chamber is tuned to the fundamental resonant frequency of the driver assembly and said front chamber is tuned to be slightly above the fundamental resonant frequency so as to produce a frequency response having a wider bandwidth.

13. An acoustical system as claimed in claim 9, wherein said rear panel wall comprises a printed circuit board for mounting of electronic circuitry.

14. An acoustical system as claimed in claim 9, further comprising a rear cover plate which is secured to the end of the housing opposite from said baffle member.

* * * * *